(12) United States Patent
Chuang et al.

(10) Patent No.: US 7,678,636 B2
(45) Date of Patent: Mar. 16, 2010

(54) SELECTIVE FORMATION OF STRESS MEMORIZATION LAYER

(75) Inventors: Harry Chuang, Austin, TX (US); Mong-Song Liang, Hsin-Chu (TW); Kong-Beng Thei, Hsin-Chu (TW); Jung-Hui Kao, Hsin-Chu (TW); Chung Long Cheng, Hsin-Chu (TW); Sheng-Chen Chung, Hsin-Chu (TW); Wen-Huei Guo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 158 days.

(21) Appl. No.: 11/520,377

(22) Filed: Sep. 13, 2006

(65) Prior Publication Data

US 2008/0003734 A1    Jan. 3, 2008

Related U.S. Application Data

(60) Provisional application No. 60/817,446, filed on Jun. 29, 2006.

(51) Int. Cl.
*H01L 21/8238* (2006.01)
*H01L 21/337* (2006.01)

(52) U.S. Cl. .................... 438/199; 438/200; 438/201; 438/203; 438/210; 438/217; 257/E21.632; 257/E21.633; 257/E21.64

(58) Field of Classification Search .......... 257/E21.632, 257/E21.633, E21.64
See application file for complete search history.

(56) References Cited

U.S. PATENT DOCUMENTS

| | | | |
|---|---|---|---|
| 6,479,350 B1 * | 11/2002 | Ling et al. | 438/265 |
| 6,492,218 B1 * | 12/2002 | Mineji | 438/199 |
| 6,762,085 B2 * | 7/2004 | Zheng et al. | 438/199 |
| 7,015,082 B2 | 3/2006 | Doris et al. | |
| 7,026,205 B2 * | 4/2006 | Ito et al. | 438/199 |
| 7,449,753 B2 * | 11/2008 | Wang et al. | 257/369 |
| 2003/0181005 A1 | 9/2003 | Hachimine et al. | |
| 2004/0104405 A1 | 6/2004 | Huang et al. | |

(Continued)

OTHER PUBLICATIONS

Chen, C-H, et al., Stress Memorization Technique (SMT) by Selectively Stained-Nitride Capping for Sub-65nm High-Performance Strained-Si Device Application, 2004 Symposium on VLSI Technology Digest of Technical Papers, 2004, pp. 56-57, IEEE.

(Continued)

*Primary Examiner*—Charles D Garber
*Assistant Examiner*—Mohsen Ahmadi
(74) *Attorney, Agent, or Firm*—Slater & Matsil, L.L.P.

(57) ABSTRACT

A method of forming a semiconductor structure includes providing a semiconductor substrate comprising a first region and a second region, forming a first PMOS device in the first region wherein a first gate electrode of the first PMOS device has a first p-type impurity concentration, forming a stress memorization layer over the first PMOS device, reducing the stress memorization layer in the first region, performing an annealing after the step of reducing the stress memorization layer in the first region, and removing the stress memorization layer. The same stress memorization layer is not reduced in a region having an NMOS device. The same stress memorization layer may not be reduced in a region including a second PMOS device.

12 Claims, 12 Drawing Sheets

U.S. PATENT DOCUMENTS

| | | |
|---|---|---|
| 2004/0159834 A1 | 8/2004 | Huang et al. |
| 2004/0180522 A1* | 9/2004 | Nishida et al. ............... 438/585 |
| 2005/0199958 A1* | 9/2005 | Chen et al. .................. 257/368 |
| 2006/0148153 A1* | 7/2006 | Kwon et al. ................. 438/197 |
| 2006/0223255 A1* | 10/2006 | Chen et al. .................. 438/199 |
| 2007/0108529 A1 | 5/2007 | Huang et al. |
| 2007/0141775 A1* | 6/2007 | Teo et al. .................... 438/231 |
| 2007/0235817 A1* | 10/2007 | Wang et al. ................. 257/392 |
| 2007/0257308 A1* | 11/2007 | Lee et al. .................... 257/334 |
| 2008/0064191 A1* | 3/2008 | Teo et al. .................... 438/530 |

OTHER PUBLICATIONS

Lu, Y. L., et al., "Mobility Enhancement in Local Strain Channel nMOSFETs by Stacked a-Si/Poly-Si Gate and Capping Nitride," IEEE Electron Device Letters, Apr. 2005, pp. 267-269, vol. 26, No. 4, IEEE.

Thompson, S. E., "Strained Si and the Future Direction of CMOS," Proceedings of the 9$^{th}$ International Database Engineering & Application Symposium (IDEAS'05), 2005, 3 pages, IEEE.

* cited by examiner

SELECTIVE FORMATION OF STRESS MEMORIZATION LAYER

This application claims the benefit of U.S. Provisional Application Ser. No. 60/817,446, filed on Jun. 29, 2006, entitled "Selective Formation of Stress Memorization Layer," which application is hereby incorporated herein by reference.

TECHNICAL FIELD

This invention relates generally to semiconductor devices, and more particularly to methods for forming metal-oxide-semiconductor (MOS) devices with stressed channel regions.

BACKGROUND

The scaling of VLSI circuits is a constant effort. With circuits becoming smaller and faster, improvement in device drive current is becoming more important. When device dimensions are reduced to 130 nm and lower, particularly 65 nm and lower, conventional methods for improving device drive current, such as shortening gate length and increasing gate capacitance, become difficult to implement. Further methods such as increasing carrier mobility have thus been explored.

Among efforts made to enhance carrier mobility, forming a stressed silicon channel is a known practice. Stress, sometimes referred to as strain, can enhance electron and hole mobility. The performance of a metal-oxide-semiconductor (MOS) device can be enhanced through a stressed-surface channel. This technique allows performance to be improved at a constant gate length, without adding complexity to circuit fabrication or design.

Typically, it is preferred for NMOS devices to have tensile stresses in their channel regions, while it is preferable for PMOS devices to have compressive stresses in their channel regions. Stresses in channel regions can be applied by forming stressed source/drain regions, stressed gate electrodes, stressed contact etch stop layers, etc. One of the methods for applying a tensile stress to a gate electrode of an NMOS device is to form a stress memorization layer, wherein a typical formation process includes blanket forming a stress memorization layer having an inherent stress, performing an annealing, and then removing the stress memorization layer. A tensile stress is thus "memorized" by the gate electrode, and is imparted to the channel region of the NMOS device.

SUMMARY OF THE INVENTION

In accordance with one aspect of the present invention, a method of forming a semiconductor structure includes providing a semiconductor substrate comprising a first region and a second region, forming a first PMOS device in the first region wherein a first gate electrode of the first PMOS device has a first p-type impurity concentration, forming a stress memorization layer over the first PMOS device, reducing the stress memorization layer in the first region, performing an annealing after the step of reducing the stress memorization layer in the first region, and removing the stress memorization layer.

In accordance with another aspect of the present invention, a method of forming a semiconductor structure includes providing a semiconductor substrate comprising a first region and a second region, forming a first PMOS device in the first region wherein a first gate electrode of the first PMOS device has a first p-type impurity concentration, forming a second PMOS device in the second region wherein a second gate electrode of the second PMOS device has a second p-type impurity concentration and wherein the first p-type impurity concentration is greater than the second p-type impurity concentration, forming a stress memorization layer over the first region and the second region, reducing the stress memorization layer in the first region, performing an annealing after the step of reducing the stress memorization layer, and removing the stress memorization layer.

In accordance with another aspect of the present invention, a method of forming a semiconductor structure includes providing a semiconductor substrate comprising a first region and a second region, forming a first PMOS device in the first region wherein a first gate electrode of the first PMOS device has a first p-type impurity concentration, forming a first NMOS device in the first region, and forming a second PMOS device in the second region, wherein a second gate electrode of the second PMOS device has a second p-type impurity concentration, and wherein the first p-type impurity concentration is greater than the second p-type impurity concentration. The method further includes forming a second NMOS device in the first region, forming a stress memorization layer over the first region and the second region, reducing a portion of the stress memorization layer wherein the portion comprises at least one of a region over the first PMOS device and a region over the second PMOS region, performing an annealing after the step of reducing the portion of the stress memorization layer, and removing the stress memorization layer.

In accordance with yet another aspect of the present invention, a semiconductor structure includes a substrate comprising a first region and a second region, a first MOS device in the first region, wherein the first MOS device comprises a first gate electrode, and a passive device in the second region, wherein the first MOS device and the passive device comprise impurities of a first conductivity type, and wherein a first concentration of the first impurities in the first MOS device is greater than a second concentration of the first impurities in the passive device.

In accordance with yet another aspect of the present invention, a semiconductor structure includes a semiconductor substrate, a first region in the semiconductor substrate, a second region in the semiconductor substrate, wherein the first region has a first active gate electrode pattern density and the second region has a second active gate electrode pattern density, and wherein the first pattern density is less than the second pattern density. The semiconductor structure further includes a first PMOS device in the first region, wherein a first gate electrode of the first PMOS device has a first p-type impurity concentration, and a second PMOS device in the second region, wherein a second gate electrode of the second PMOS device has a second p-type impurity concentration, and wherein the first p-type impurity concentration is greater than the second p-type impurity concentration.

By removing the stress memorization layer from PMOS devices with high impurity concentrations, the penetration of impurities into the gate dielectrics is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

It has been found that some MOS devices, particularly PMOS devices, have relatively high leakage currents compared to other MOS devices. Experiments have revealed that boron penetration into (and possibly through) gate dielectrics is one of the reasons. Further experiments have revealed that the formation of stress memorization layers combined with a high concentration of p-type impurities, particularly boron, in gate electrodes causes the boron penetration, and thus results in high leakage currents and degradation of the performance of the respective PMOS devices. Boron penetration also affects the gate oxide integrity. The adverse effects caused by boron penetration also include increased plasma induced damage to the gate dielectric, increased negative bias temperature instability (NBTI), and increased leakage currents.

The intermediate stages of manufacturing preferred embodiments of the present invention, which reduces the above-discussed adverse effects, are illustrated. Throughout the various views and illustrative embodiments of the present invention, like reference numbers are used to designate like elements.

Figure 1:
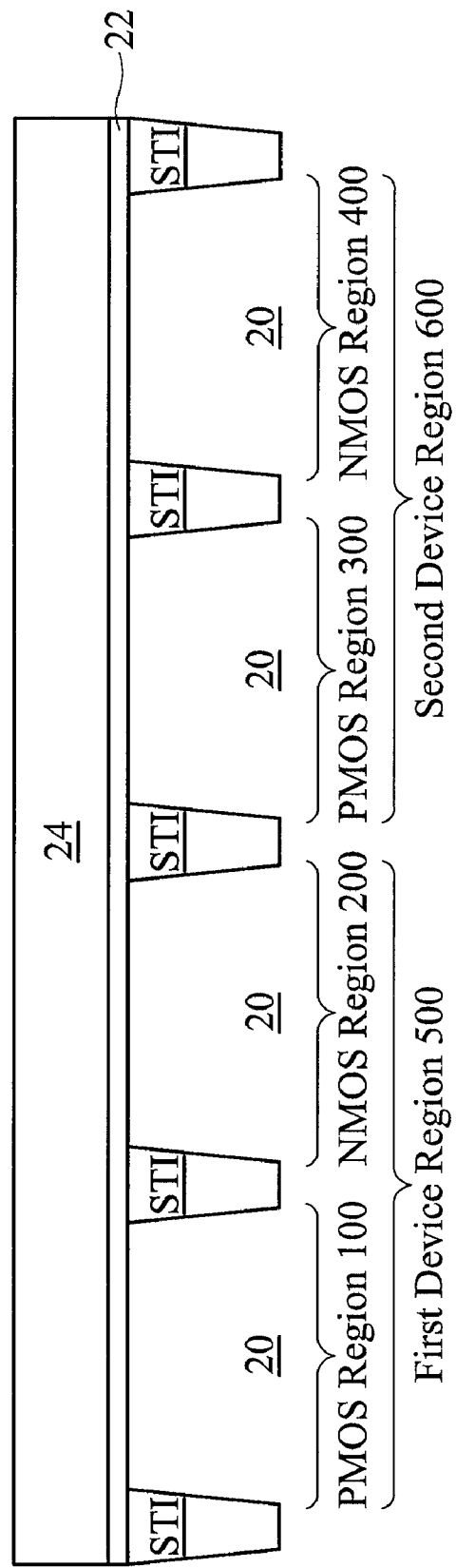
FIGS. 1 through 8C are cross-sectional views of intermediate stages in the manufacture of an embodiment.

FIG. 1 illustrates a substrate 20, which includes a first device region 500 and a second device region 600 isolated by shallow trench isolation (STI) regions STI. Substrate 20 preferably comprises bulk silicon, although other commonly used structures and materials such as silicon on insulator (SOI) can be used. The first device region 500 further includes a PMOS region 100 for forming a first PMOS device (not shown) and an NMOS region 200 for forming a first NMOS device (not shown). The second device region 600 further includes a PMOS region 300 for forming a second PMOS device (not shown) and an NMOS region 400 for forming a second NMOS device (not shown). Substrate 20 is preferably lightly doped.

In the preferred embodiment, devices in the first device region 500 have a higher doping concentration than devices in the second device region 600. A ratio of the doping concentration in the first device region 500 to the doping concentration in the second device region 600 is preferably no less than about 1.25, and more preferably between about 1.5 and about 50, wherein the doping concentration refers to the majority dopant in gate electrodes if the devices are MOS devices. In other embodiments, the first region has a first pattern density and the second region has a second pattern density, and the first pattern density is preferably less than the second pattern density, with a preferred ratio of the second pattern density to the first pattern density of between about 1 and about 8.5. The second pattern density is preferably defined as a ratio of a total area of all gate electrodes in a unit area, for example, a unit memory cell, divided by the unit area. The first pattern density is calculated as a total area of all gate electrodes in a sample area having a same size as the unit area divided by the sample area, wherein the sample area is preferably close to region 500. The areas of dummy gates are not taken into account when calculating pattern densities. In an exemplary embodiment wherein the first region is a logic region and the second region is a memory region, the pattern density ratio of the second region (memory region) to the first region (logic region) for this invention ranges between about 8.5 (wherein pattern densities in the memory region and the logic region are 85% and 10%, respectively) and about 1 (wherein pattern densities the in memory region and the logic region are 20% and 20%, respectively). Typically, since the pattern density of a memory region is defined as the pattern density of unit cells in the memory region, the less dense region around the dense memory region is not taken into the calculation of pattern densities.

In a first exemplary embodiment, the first device region 500 is a core device region and the second device region 600 is an input/output (I/O) region. In a second exemplary embodiment, the first device region 500 is a core circuit region, while the second device region 600 is a memory region, including, but not limited to, static random access memory cells, dynamic random access memory cells, fuses, flash memory cells, multilevel nonvolatile memory cells, ferro-electric memory cells, magneto random access memory cells, and the like. In yet a third exemplary embodiment, the first device region 500 comprises active devices, while the second device region 600 comprises passive devices, which includes, but are not limited to, resistors, capacitors, electrostatic discharge (ESD) devices, fuses, varactors, seal rings, stress corners, and combinations thereof.

A gate dielectric layer 22 is formed on substrate 20. In the preferred embodiment, gate dielectric layer 22 has a high dielectric constant (k value), preferably greater than about 3.9. Gate dielectric layer 22 preferably comprises silicon oxide, silicon nitride, oxynitrides or dielectric metal oxides, such as $HfO_2$, $HfZrO_x$, $HfSiO_x$, $HfTiO_x$, $HfAlO_x$, and the like. The preferred methods for forming gate dielectric layer 22 include chemical vapor deposition (CVD) techniques such as low temperature CVD (LTCVD), low pressure CVD (LPCVD), rapid thermal CVD (RTCVD), plasma enhanced CVD (PECVD), atomic layer deposition methods such as atomic layer CVD, and other commonly used methods.

A gate electrode layer 24 is formed on gate dielectric layer 22. Gate electrode layer 24 may include polysilicon, metals, metal silicides, metal nitrides, and other commonly used materials.

In the preferred embodiment, gate dielectric layer 22 and gate electrode layer 24 are blanket formed in the first and the second device regions. In alternative embodiments, gate dielectric layer 22 and gate electrode layer 24 are separately formed in the first device region 500 and the second device region 600 using different materials. In an exemplary embodiment, in the first device region, gate dielectric layer 22 is formed of a high-k dielectric material with a thickness, for example, between about 10 Å and about 30 Å. In the second device region, gate dielectric layer 22 is formed of silicon oxide with a thickness, for example, between about 22 Å and about 70 Å. Accordingly, the operation voltage of the MOS devices in the first device region 500 may be lower than the operation voltage of the MOS devices in the second device region. For example, the operation voltage of MOS devices in the first region may be between about 0.5V and about 1.2V, while the operation voltage of MOS devices in the second region is between about 1.0V and about 3.0V.

Figure 2:
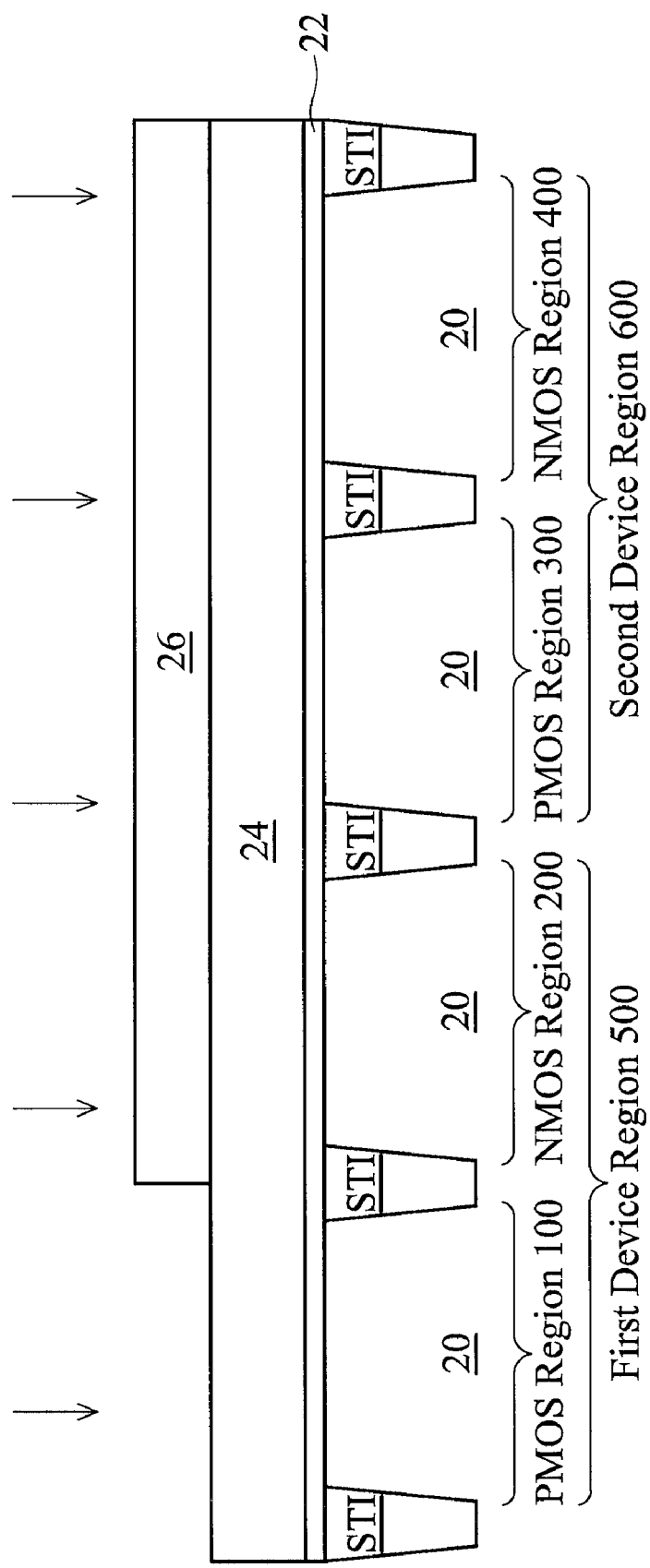

FIG. 2 illustrates the pre-gate doping of p-type impurities into gate electrode layer 24. First, a photoresist 26 is formed and patterned, covering regions 200, 300 and 400, while leaving PMOS region 100 exposed. A p-type pre-gate doping (implantation) is then performed to introduce p-type impurities, such as boron, indium, and the like. The preferred dosage is between about $1E15/cm^2$ and about $5E15/cm^2$. Photo resist 26 is then removed.

Optionally, another photo resist (not shown) is formed, which covers regions 100, 200 and 400, while leaving PMOS region 300 exposed. Another p-type impurity (such as boron, and indium, and the like) implantation is then performed. Preferably, the dosage for implanting PMOS region 300 is less than the dosage for implanting PMOS region 100. In an exemplary embodiment, the dosage for implanting region 300 is between about $1E13/cm^2$ and about $3E15/cm^2$. N-type pre-doping can also be performed to NMOS regions 200 and 400 in separate steps. One skilled in the art will realize the corresponding process steps.

Figure 3:
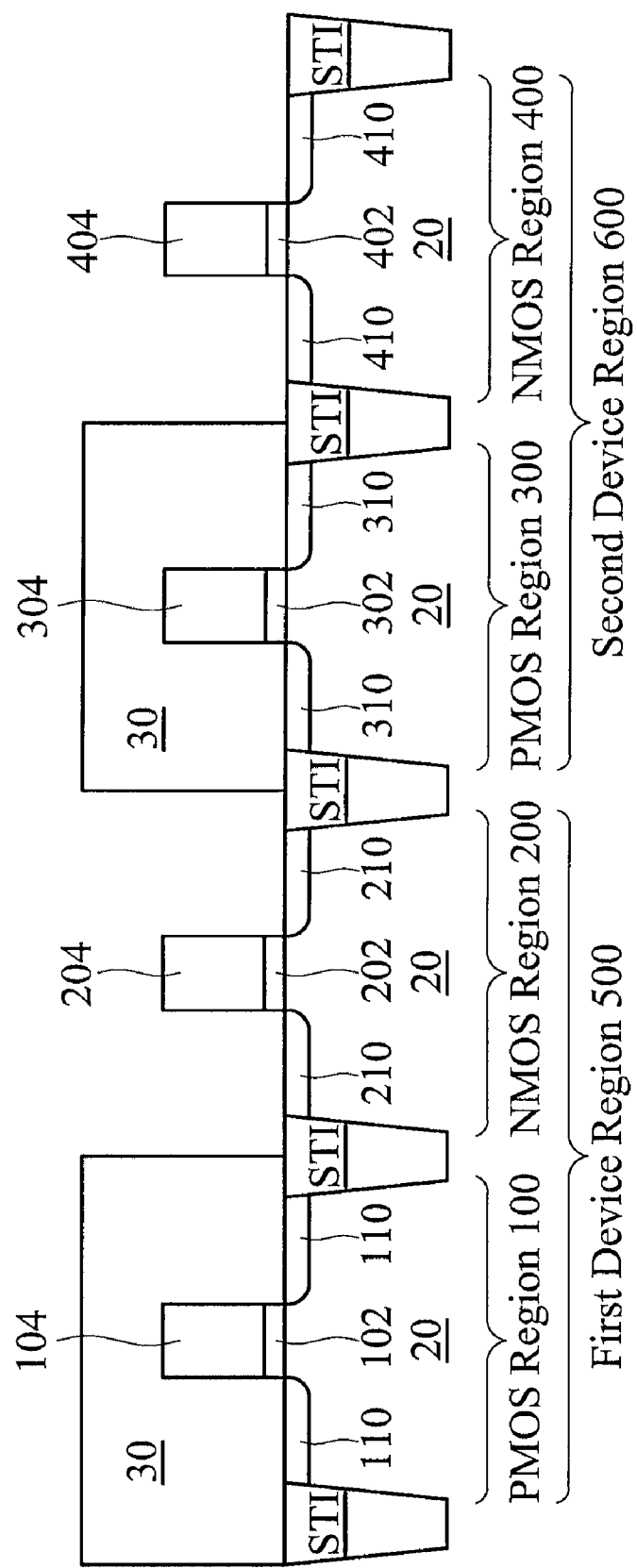

FIG. 3 illustrates the formation of gate stacks and lightly-doped drain/source (LDD) regions for PMOS and NMOS devices. Gate dielectric layer 22 and gate electrode layer 24 are patterned, forming gate stacks in regions 100, 200, 300 and 400. The patterned gate electrode layer 24 and gate dielectric layer 22 form gate electrodes 104, 204, 304 and 404 and gate dielectrics 102, 202, 302 and 402, in regions 100, 200, 300 and 400, respectively.

To form LDD regions 210 and 410, a photo resist 30 is formed over and masks PMOS regions 100 and 300, and an implantation is performed to introduce n-type impurities into the NMOS regions 200 and 400. Photo resist 30 is then removed. Similarly, by forming a photo resist (not shown) covering regions 200 and 400 and implanting regions 100 and 300 with p-type impurities, p-type LDD regions 110 and 310 can be formed.

In alternative embodiments, LDD regions 110 and 310 are separately formed, each by forming a photo resist (not shown) to cover other regions. LDD regions 110 may then be implanted with a higher dosage than LDD regions 310.

Figure 4:
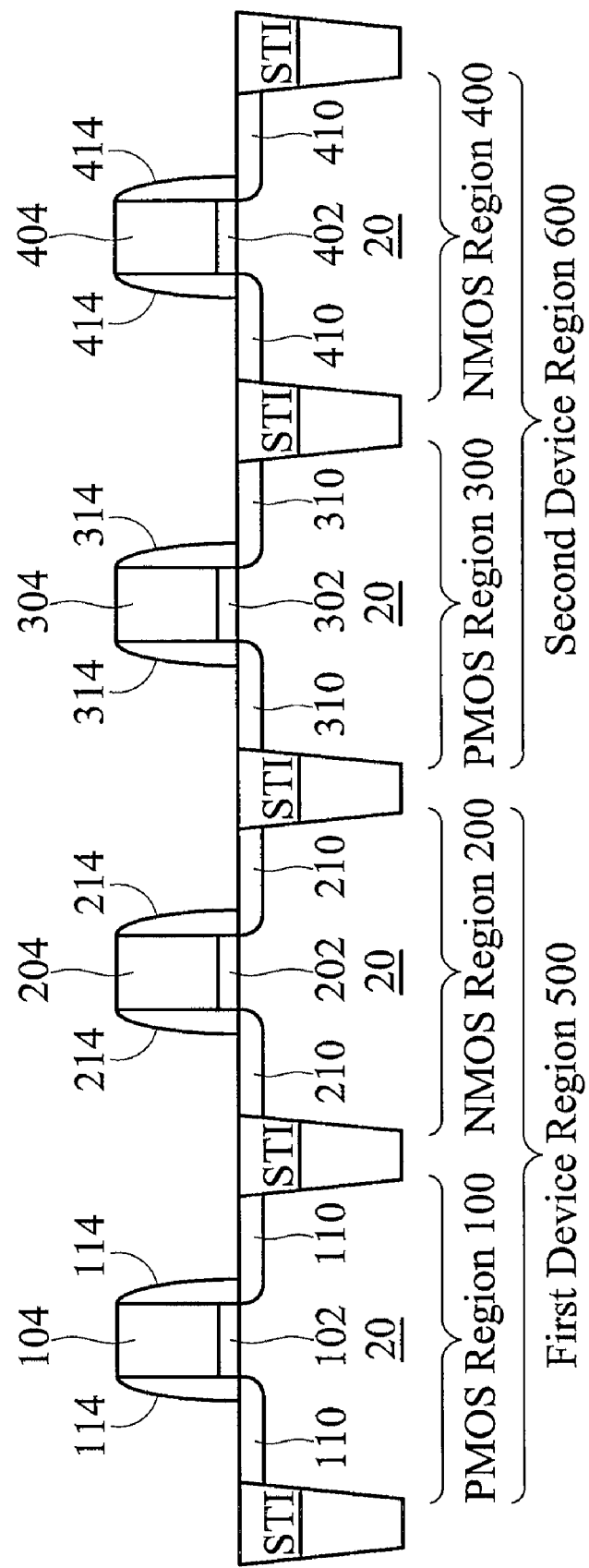

Referring to FIG. 4, gate spacers 114, 214, 314 and 414 are then formed, as shown in FIG. 4. As is known in the art, gate spacers are formed by forming one or more spacer layers (not shown), and then etching the spacer layer(s). In the preferred embodiment, the spacer layer includes a nitride layer on a liner oxide layer. The preferred spacer deposition methods include PECVD, LPCVD, sub-atmospheric chemical vapor deposition (SACVD), and the like.

Figure 5:
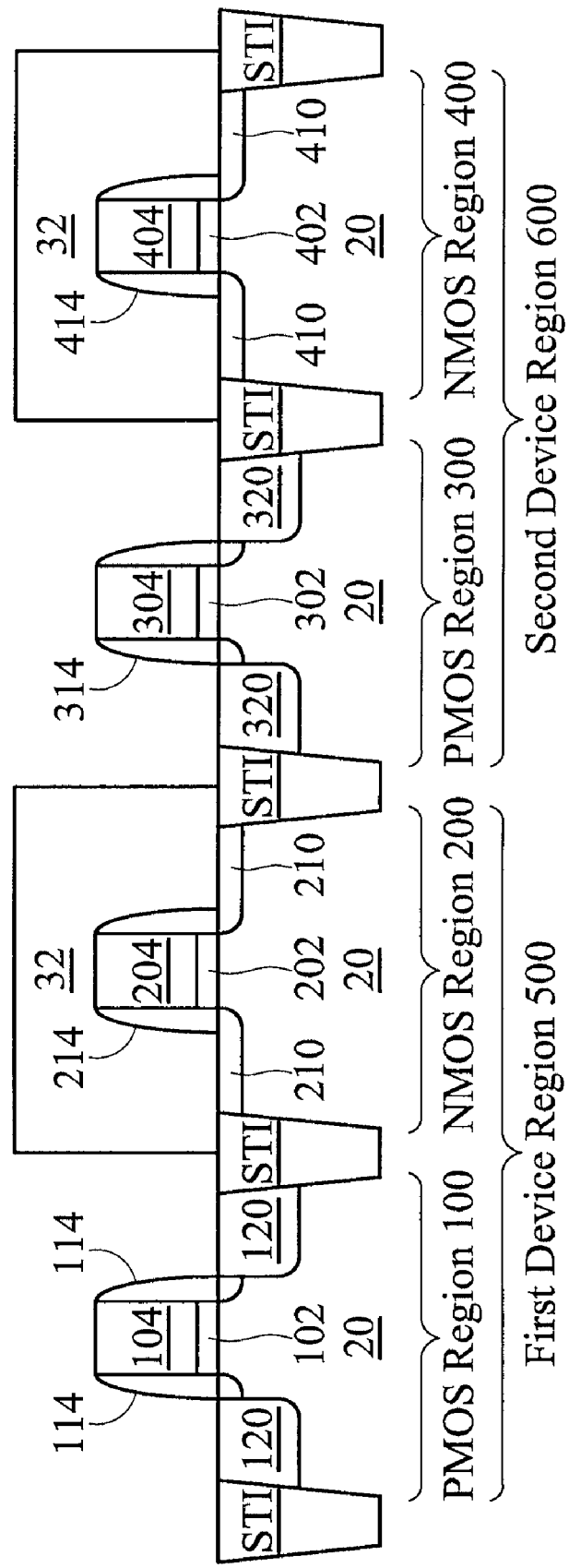

FIG. 5 illustrates the formation of p-type source/drain regions 120 and 320. In the preferred embodiment, source/drain regions 120 and 320 include semiconductor stressors such as SiGe, SiGe:C, SiC, GaAs, or InP. In a process for forming the semiconductor stressors, a photo resist 32 is formed covering regions 200 and 400. Recesses are formed in substrate 20 along the outside edges of spacers 114 and 314, preferably by etching isotropically and/or anisotropically. The semiconductor stressors are then formed in the recesses, preferably by epitaxial growth. P-type impurities such as boron and/or indium, or the like, may optionally be doped during the epitaxial growth. Photo resist 32 is then removed. An implantation is then performed to implant p-type impurities, such as boron, into source/drain regions 120 and 320.

Figure 6:
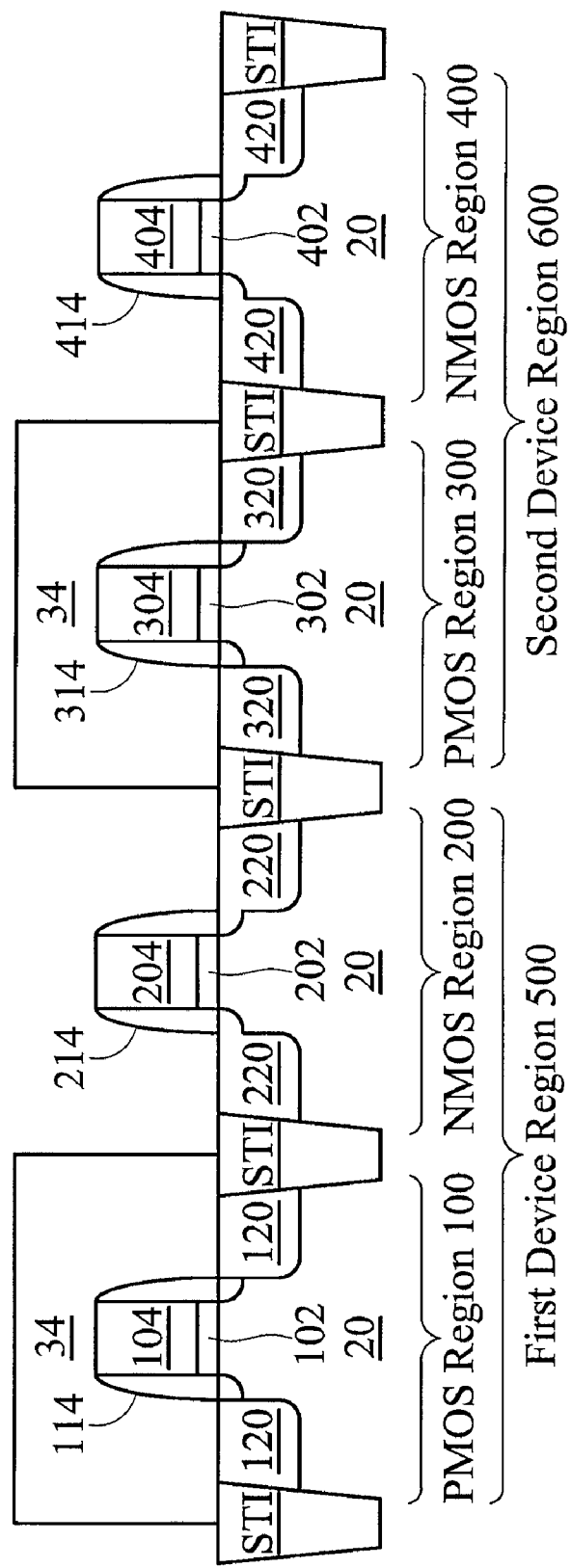

FIG. 6 illustrates the formation of deep source/drain regions 220 and 420, preferably by implanting n-type impurities. During the implantation, PMOS regions 100 and 300 are masked by a photo resist 34. The resulting source/drain regions 220 and 420 are substantially aligned with the edges of spacers 214 and 414, respectively. Photo resist 34 is then removed.

In alternative embodiments, source/drain regions 120 and 320 are separately formed, each by forming a photo resist (not shown) to cover other regions. Source/drain regions 120 may then be implanted with a higher dosage than source/drain regions 320.

Figure 7:
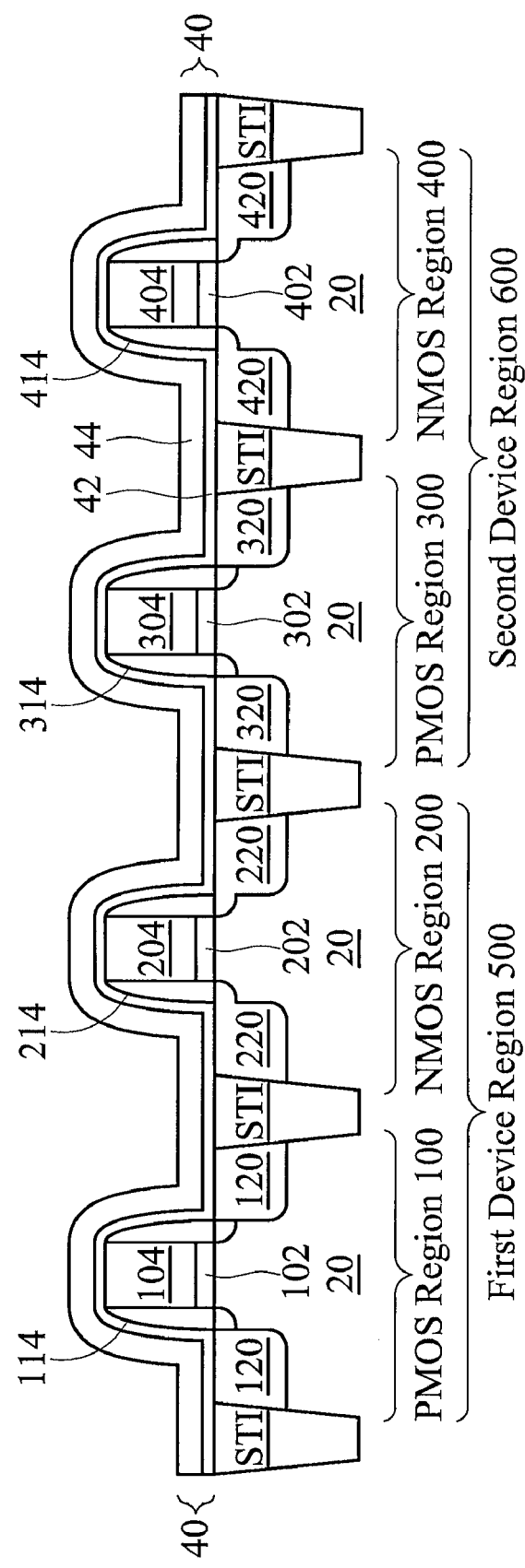

Referring to FIG. 7, a stress memorization layer 40 is blanket formed. In one embodiment, stress memorization layer 40 has a composite structure including, for example, an upper layer 44 on a lower layer 42. The upper layer 44 preferably has a thickness of less than about 500 Å, and more preferably between about 30 Å and about 500 Å, while the lower layer 42 preferably has a thickness of between about 10 Å and about 300 Å. In an exemplary embodiment, upper layer 44 comprises silicon nitride, while lower layer 42 comprises an oxide. In another embodiment, stress memorization layer 40 includes a single layer, which may be formed of nitrides, oxynitrides, tetra ethyl ortho silicate (TEOS), and other materials with internal stresses. The single layered stress memorization layer 40 preferably has a tensile stress.

The preferred method for forming stress memorization layer 40 includes low-pressure chemical vapor deposition (LPCVD). However, other methods such as plasma enhanced chemical vapor deposition may also be used. The formation temperature is preferably lower than about 800° C. As the formation process may use hydrogen-containing precursors, it is preferable for the hydrogen concentration in stress memorization layer 40 to be less than about 30 percent. This is because a high hydrogen concentration tends to have the effect of increasing boron penetration. The formation process of stress memorization layer 40 is also controlled so that the density of stress memorization layer 40 is less than about three $g/cm^3$.

FIGS. 8A through 8D illustrate the reduction, which includes the removal or thinning, of stress memorization layer 40 from PMOS regions 100 and 300. The purpose of reducing the stress memorization layer 40 in the PMOS regions 100 and 300 is that the formation of stress memorization layer 40 results in beneficial stresses for NMOS devices but detrimental stresses for PMOS devices. Stress memorization layer 40 in NMOS regions 200 and 400 is preferably preserved. For PMOS devices, however, if the p-type impurity concentrations in the gate electrodes are high, for example, formed with an implant dosage of greater than about $1E15/cm^2$, the stress memorization layer over the respective MOS device is preferably removed or thinned. If the gate impurity concentration is low, for example, formed with an implant dosage of less than about $1E15/cm^2$, the stress memorization layer may be reduced or preserved.

Figure 8A:
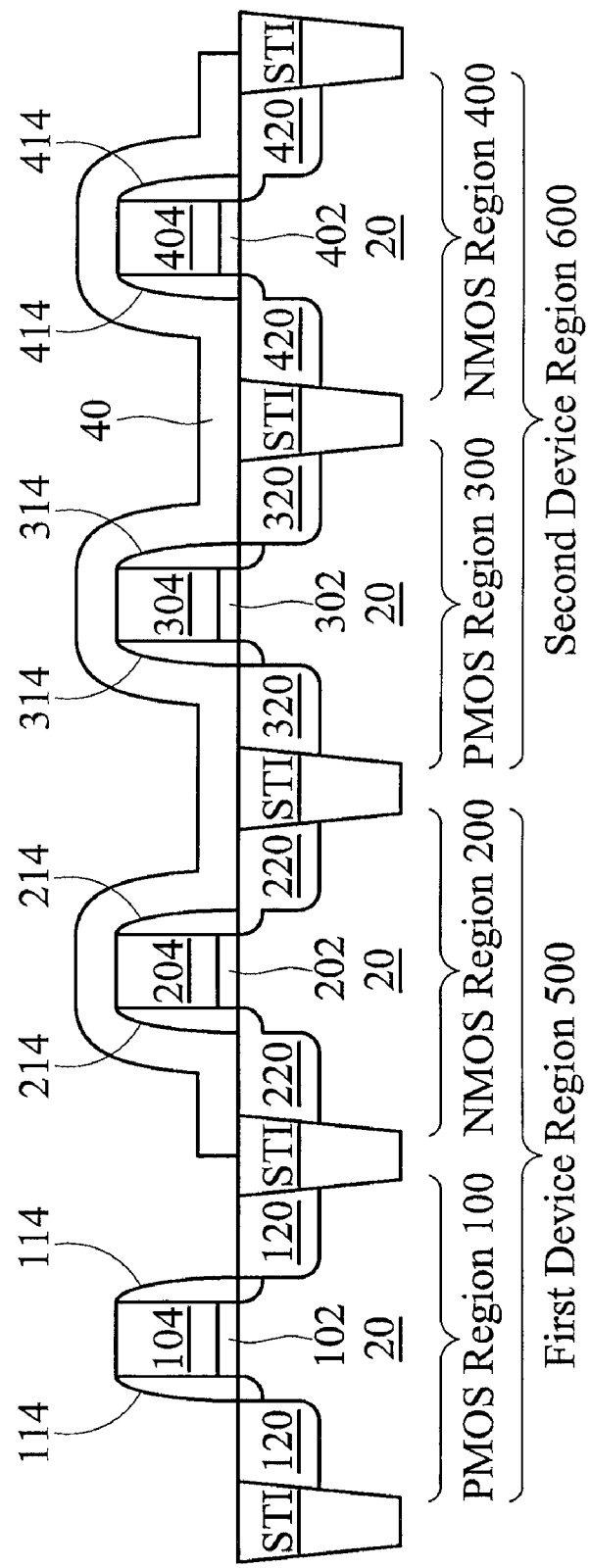
FIG. 8D illustrates another embodiment, wherein MOS devices and passive devices are formed.
Figure 8B:
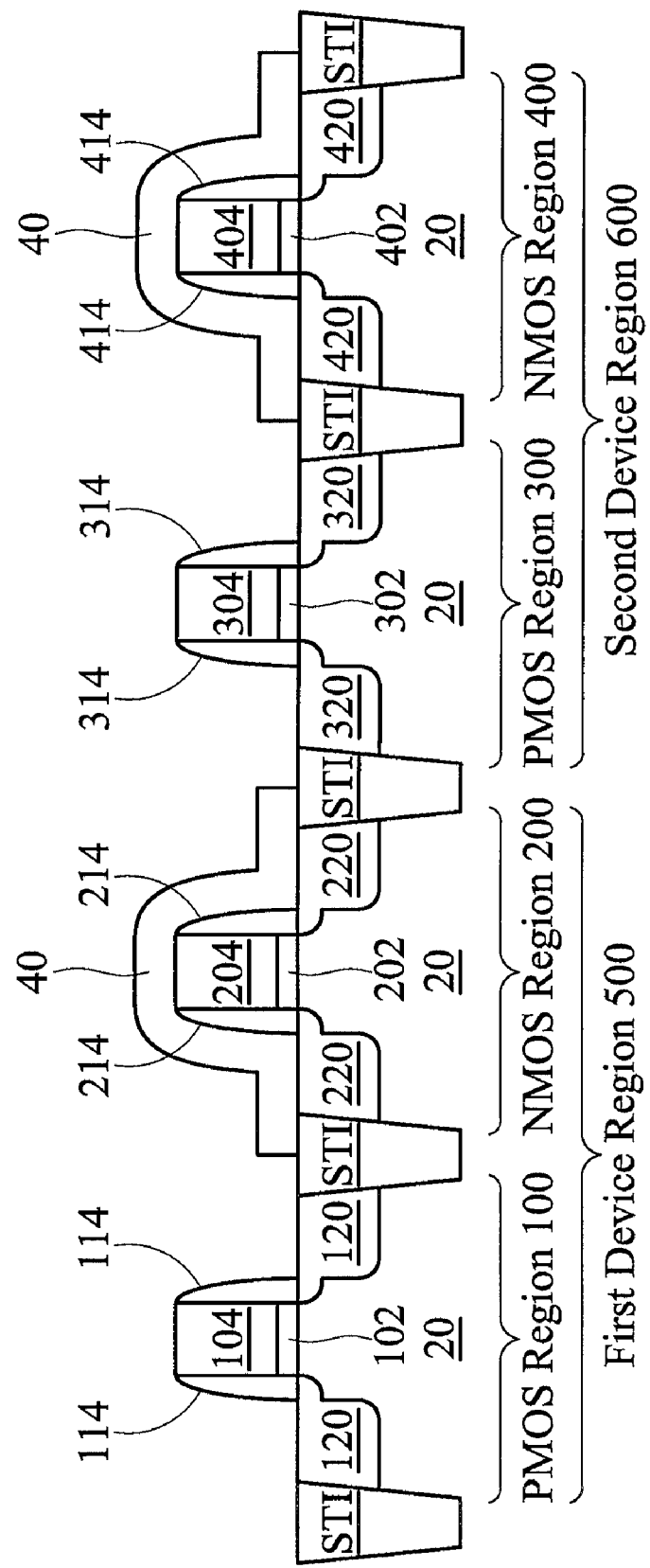
Figure 8C:
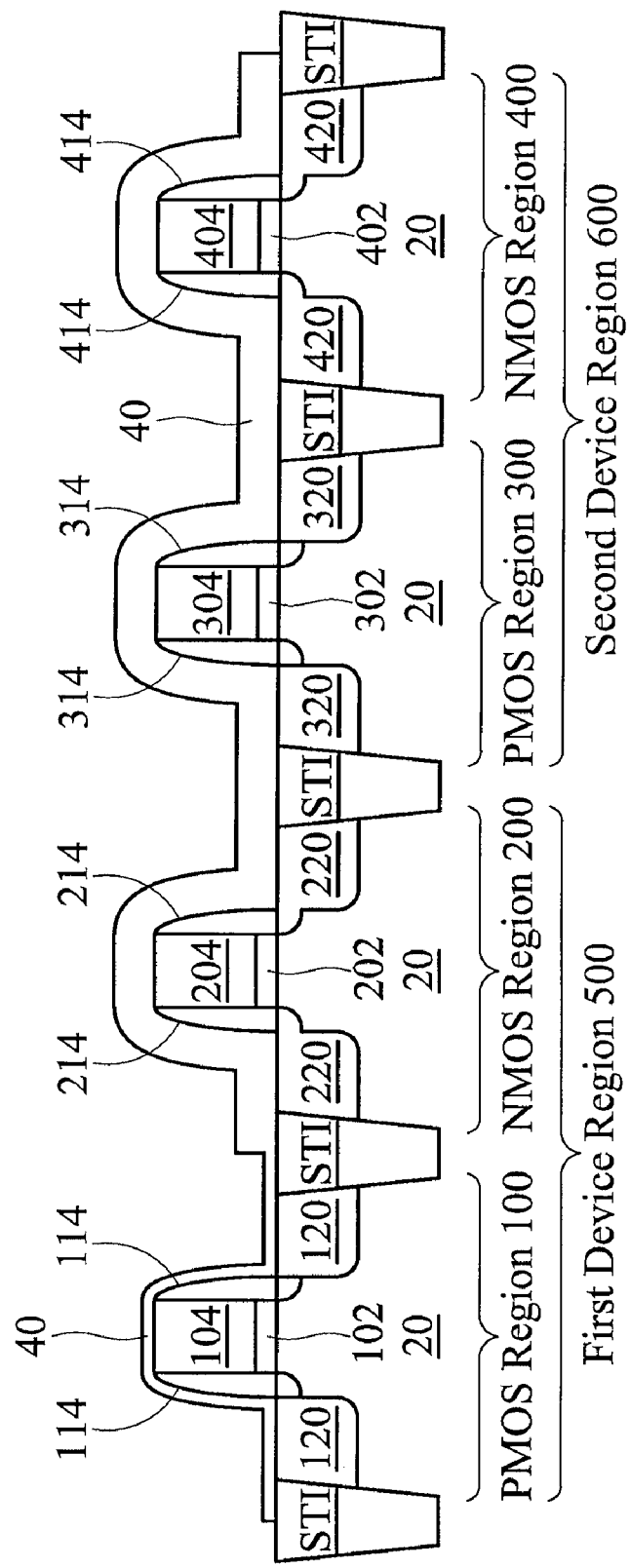

In FIG. 8A, stress memorization layer 40 in PMOS region 100 is removed. Stress memorization layer over PMOS region 300 is not removed since gate electrode 304 has a low p-type impurity concentration. In alternative embodiments, as shown in FIG. 8B, stress memorization layer 40 is removed from both PMOS regions 100 and 300. In yet other embodiments, as shown in FIG. 8C, only stress memorization layer 40 in PMOS region 100 is thinned. In yet other embodiments, stress memorization layer 40 in PMOS regions 100 and 300 is thinned.

Figure 8D:
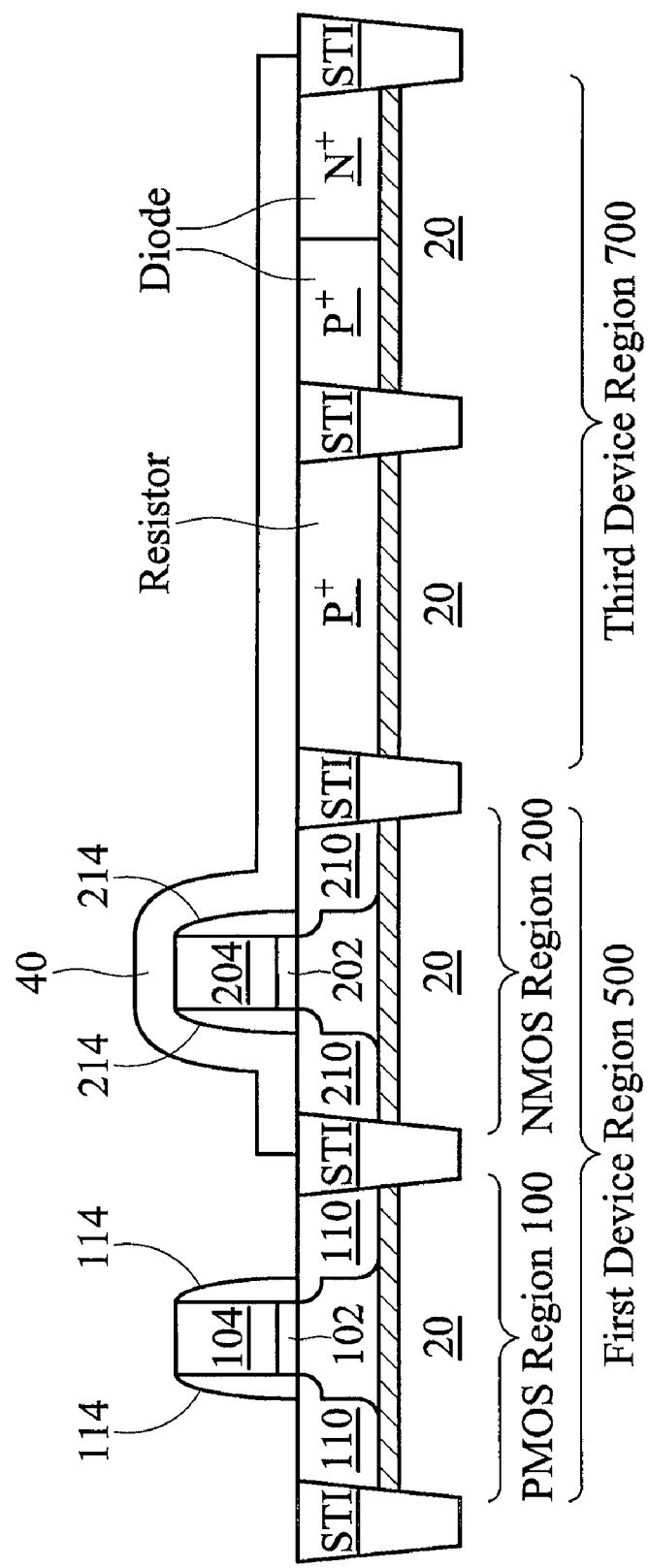

FIG. 8D illustrates the formation of stress memorization layer 40 in the first device region 500 and a third device region. Preferably, the third device region 700 includes passive devices, such as resistors, capacitors, diodes, fuses, ESD devices, seal rings, varactors, and the like. As is known in the art, some of these devices may need to be doped, and the doping is likely to be performed simultaneously with the formation of MOS devices. Preferably, these devices have a lower p-type impurity concentration than the MOS device in PMOS regions 100. This can be achieved, for example, by doping/forming these devices using a same mask as used for doping MOS devices in the second device region 600 (refer to FIG. 1). FIG. 8D only illustrates a resistor and a diode as examples. One skilled in the art will realize the respective structures of other devices.

In FIG. 8D, stress memorization layer 40 may be reduced or may be left in place in the third device region, depending on the design preference. Alternatively, stress memorization layer 40 in the third device region 700 may be thinned (not shown) or removed.

The structures as shown in FIG. 8A through 8D are then annealed. For example, an RTA is performed with a temperature of between about 900° C. and about 1090° C. Other common annealing methods, such as flashing annealing, furnace annealing, laser annealing, and the like, can also be used. During the annealing, stress is transferred from stress memorization layer 40 to the underlying structures. Even after the removal of stress memorization layer 40, the stress is still "memorized" by the gate electrodes and the source/drain regions of NMOS devices, and the stress will be applied to their channel regions.

Figure 9:
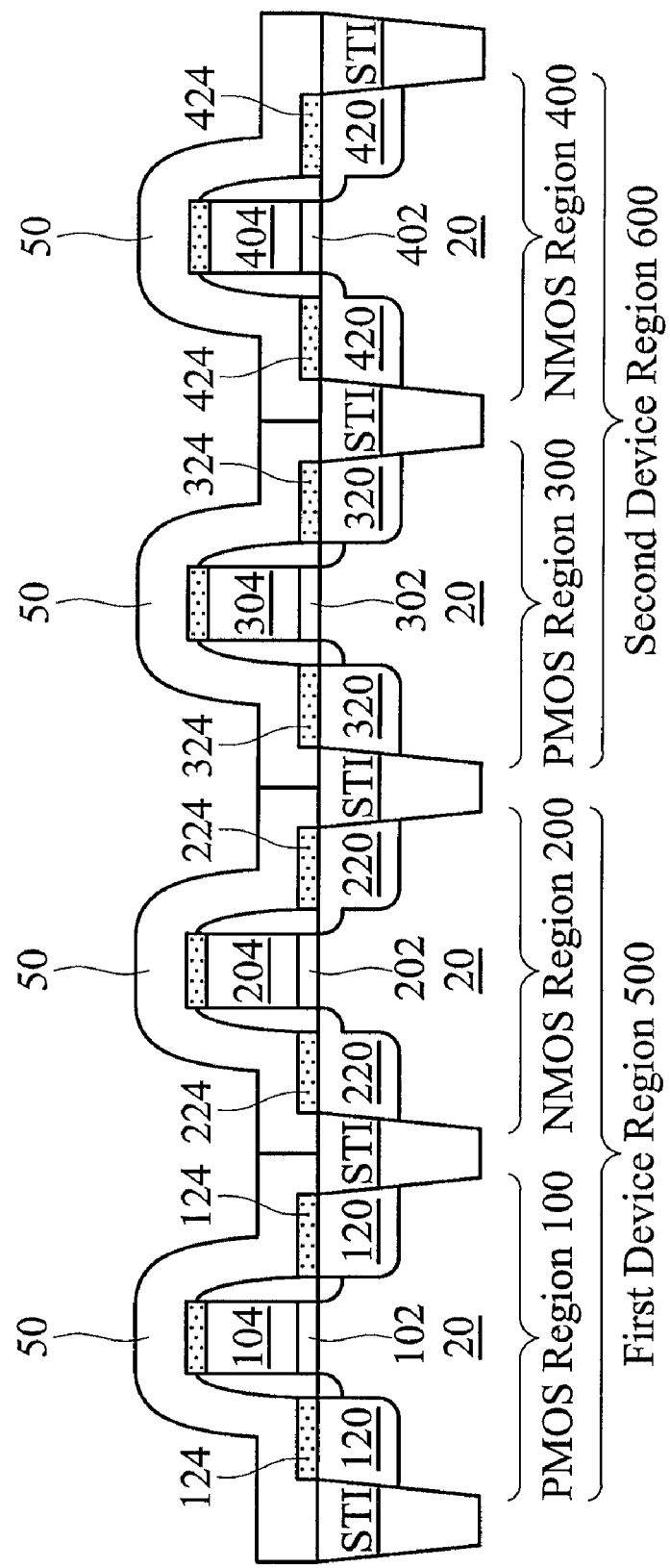
FIG. 9 illustrates a cross-sectional view of an end structure of an embodiment.

Referring to FIG. 9, stress memorization layer 40 is removed. To finish the formation of MOS devices, silicide regions 124, 224, 324 and 424 are formed on exposed surfaces of the source/drain regions and gate electrodes of the respective MOS devices, followed by the formation of an etch stop layer (ESL) 50 and an inter-layer dielectric (ILD) (not shown). As is known in the art, the portions of ESL 50 in regions 100 and 300 are preferably compressive, while the portions in regions 200 and 400 are preferably tensile. The details for forming the silicide regions, the ESL and the ILD are well known in the art, and thus are not repeated herein. Also, the spacers for PMOS devices 114 and 314, or the spacers for NMOS devices 214 and 414 may be removed, partially or wholly, before the deposition of ESL 50.

In the embodiments discussed in the preceding paragraphs, a stress memorization layer is selectively removed or thinned from PMOS devices having high p-type impurity concentrations in their gate electrodes. Therefore, p-type impurity penetration is reduced while the benefits of a stressed gate electrode, hence stressed channel regions of NMOS devices, is preserved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
    providing a semiconductor substrate comprising a first region and a second region;
    forming a first p-type metal-oxide-semiconductor (PMOS) device in the first region, wherein a first gate electrode of the first PMOS device has a first p-type impurity concentration;
    forming a stress memorization layer over the first PMOS device in the first region;
    reducing the stress memorization layer over the first gate electrode and a first source/drain region of the first PMOS device in the first region, at least a portion of the stress memorization layer remaining over the first PMOS device;
    performing an annealing after the step of reducing the stress memorization layer in the first region;
    removing the stress memorization layer; and
    forming a second PMOS device in the second region, wherein the first region has a first active gate electrode pattern density and the second region has a second active gate electrode pattern density, and wherein the first active gate electrode pattern density is less than the second active gate electrode pattern density.

2. The method of claim 1, wherein p-type impurities in the first gate electrode comprise boron.

3. The method of claim 1, wherein the step of forming the first PMOS device comprises:
    forming a gate dielectric layer on the semiconductor substrate;
    forming a gate electrode layer on the gate dielectric layer;
    doping the gate electrode layer with a p-type impurity; and
    patterning the gate dielectric layer and the gate electrode layer to form a gate stack.

4. The method of claim 1 further comprising forming a second n-type MOS (NMOS) device in the second region, wherein the stress memorization layer over the second NMOS device is not reduced when the step of reducing the stress memorization layer in the first region is performed.

5. The method of claim 1 further comprising forming a passive device in the second region, wherein the stress memorization layer in the second region is not reduced when the step of reducing the stress memorization layer in the first region is performed.

6. A method of forming a semiconductor structure, the method comprising:
    providing a semiconductor substrate comprising a first region and a second region;
    forming a first p-type metal-oxide-semiconductor (PMOS) device in the first region, wherein a first gate electrode of the first PMOS device has a first p-type impurity concentration;
    forming a stress memorization layer over the first PMOS device in the first region;
    reducing the stress memorization layer in the first region;
    performing an annealing after the step of reducing the stress memorization layer in the first region;
    removing the stress memorization layer; and
    forming a second PMOS device in the second region, wherein a second gate electrode of the second PMOS device has a second p-type impurity concentration, and wherein the first p-type impurity concentration is greater than the second p-type impurity concentration, and wherein the stress memorization layer over the second PMOS device is not reduced when the step of reducing the stress memorization layer in the first region is performed.

7. A method of forming a semiconductor structure, the method comprising:
    providing a semiconductor substrate comprising a first region and a second region;

forming a first PMOS device in the first region, wherein a first gate electrode of the first PMOS device has a first p-type impurity concentration;

forming a second PMOS device in the second region, wherein a second gate electrode of the second PMOS device has a second p-type impurity concentration, and wherein the first p-type impurity concentration is greater than the second p-type impurity concentration;

forming a stress memorization layer over the first region and the second region;

reducing the stress memorization layer in the first region;

performing an annealing after the step of reducing the stress memorization layer; and removing the stress memorization layer.

8. The method of claim 7, wherein the first region has a first active gate electrode pattern density and the second region has a second active gate electrode pattern density, and wherein the first active gate electrode pattern density is less than the second active gate electrode pattern density.

9. The method of claim 7, wherein the step of forming the first PMOS device comprises:

forming a gate dielectric layer on the semiconductor substrate;

forming a gate electrode layer on the gate dielectric layer;

doping the gate electrode layer in the first region with a p-type impurity; and patterning the gate dielectric layer and the gate electrode layer to form a gate stack.

10. The method of claim 7, wherein the first PMOS device has a higher p-type impurity concentration in a source/drain region than does a source/drain region of the second PMOS device.

11. The method of claim 7, wherein the first PMOS device has a higher p-type impurity concentration in a lightly-doped source/drain region than does a lightly-doped source/drain region of the second PMOS device.

12. A method of forming a semiconductor structure, the method comprising:

providing a semiconductor substrate comprising a first region and a second region;

forming a first PMOS device in the first region, wherein a first gate electrode of the first PMOS device has a first p-type impurity concentration;

forming a second PMOS device in the second region, wherein a second gate electrode of the second PMOS device has a second p-type impurity concentration, and wherein the first p-type impurity concentration is greater than the second p-type impurity concentration;

forming a stress memorization layer over the first region and the second region;

reducing the stress memorization layer in the first region;

performing an annealing after the step of reducing the stress memorization layer; and removing the stress memorization layer, wherein the step of forming the second PMOS device comprises pre-gate doping a gate electrode of the second PMOS device with a third p-type impurity before patterning a gate dielectric layer for the first PMOS device, wherein the first gate electrode of the first PMOS device has a higher concentration of the third p-type impurity than does the second gate electrode of the second PMOS device.

* * * * *